United States Patent
Fang et al.

(10) Patent No.: US 11,569,093 B2
(45) Date of Patent: Jan. 31, 2023

(54) METHOD FOR MAKING MOSFET AND MOSFET

(71) Applicant: HUA HONG SEMICONDUCTOR (WUXI) LIMITED, Wuxi (CN)

(72) Inventors: Mingxu Fang, Wuxi (CN); Yu Chen, Wuxi (CN); Hualun Chen, Wuxi (CN)

(73) Assignee: Hua Hong Semiconductor (Wuxi) Limited, Wuxi (CN)

( * ) Notice: Subject to any disclaimer, the term of this patent is extended or adjusted under 35 U.S.C. 154(b) by 0 days.

(21) Appl. No.: 17/230,234

(22) Filed: Apr. 14, 2021

(65) Prior Publication Data
US 2022/0059354 A1 Feb. 24, 2022

(30) Foreign Application Priority Data
Aug. 18, 2020 (CN) .......................... 202010832086.X (51) Int. Cl.
| | | |
|---|---|---|
| *H01L 21/28* | (2006.01) | |
| *H01L 21/265* | (2006.01) | |
| *H01L 21/3115* | (2006.01) | |
| *H01L 21/324* | (2006.01) | |
| *H01L 29/51* | (2006.01) | |
| *H01L 29/66* | (2006.01) | |
| *H01L 29/78* | (2006.01) | |

(52) U.S. Cl.
CPC .. *H01L 21/28176* (2013.01); *H01L 21/26513* (2013.01); *H01L 21/31155* (2013.01); *H01L 21/324* (2013.01); *H01L 29/51* (2013.01); *H01L 29/6659* (2013.01); *H01L 29/7833* (2013.01)

(58) Field of Classification Search
None
See application file for complete search history.

(56) References Cited

U.S. PATENT DOCUMENTS

| | | | | | |
|---|---|---|---|---|---|
| 5,750,435 A | * | 5/1998 | Pan | ................... | H01L 21/26586 257/E21.345 |
| 6,756,291 B1 | * | 6/2004 | Hao | .................. | H01L 21/28061 438/657 |

FOREIGN PATENT DOCUMENTS

| | | | | | |
|---|---|---|---|---|---|
| CN | 102468163 A | | 5/2012 | | |
| CN | 102468237 | * | 5/2012 | ........... | H01L 21/336 |
| CN | 102468237 A | | 5/2012 | | |
| CN | 104241130 A | * | 12/2014 | ....... | H01L 29/66636 |

OTHER PUBLICATIONS

Search Report issued in corresponding Chinese Patent Application No. 202010832086X, dated Jul. 7, 2022.

\* cited by examiner

*Primary Examiner* — Alexander G Ghyka
(74) *Attorney, Agent, or Firm* — Dilworth IP, LLC (57) ABSTRACT

A method for making a MOSFET includes forming a gate oxide layer on a substrate; depositing and forming a polysilicon layer on the gate oxide layer; removing the polysilicon layer and the gate oxide layer in a target area by means of dry etching. The remaining gate oxide layer forms a gate oxide of the MOSFET. The remaining polysilicon layer forms a gate of the MOSFET. The method further includes performing LDD implantation on the substrate at both sides of the gate, to form a first LDD area and a second LDD area respectively; and performing SD implantation to form a source and a drain in the substrate at both sides of the gate respectively. Before one of the steps after the depositing and forming a polysilicon layer on the gate oxide layer, fluorine ion implantation is performed.

6 Claims, 10 Drawing Sheets

METHOD FOR MAKING MOSFET AND MOSFET

CROSS-REFERENCES TO RELATED APPLICATIONS

This application claims priority to Chinese patent application No. CN 202010832086.X, filed on Aug. 18, 2020, and entitled "METHOD FOR MAKING MOSFET AND MOSFET", the disclosure of which is incorporated herein by reference in entirety.

TECHNICAL FIELD

The present application relates to the technical field of semiconductor manufacturing, in particular to a method for making a metal-oxide-semiconductor field-effect transistor (MOSFET) and a MOSFET.

BACKGROUND

The MOSFET (hereinafter referred to as "MOS") is an electronic device widely used in analog circuits and digital circuits. Based on different carrier polarities, the MOS can be classified into "P-type" MOS and "N-type" MOS, which can be respectively referred to as PMOS and NMOS for short.

Figure 1:
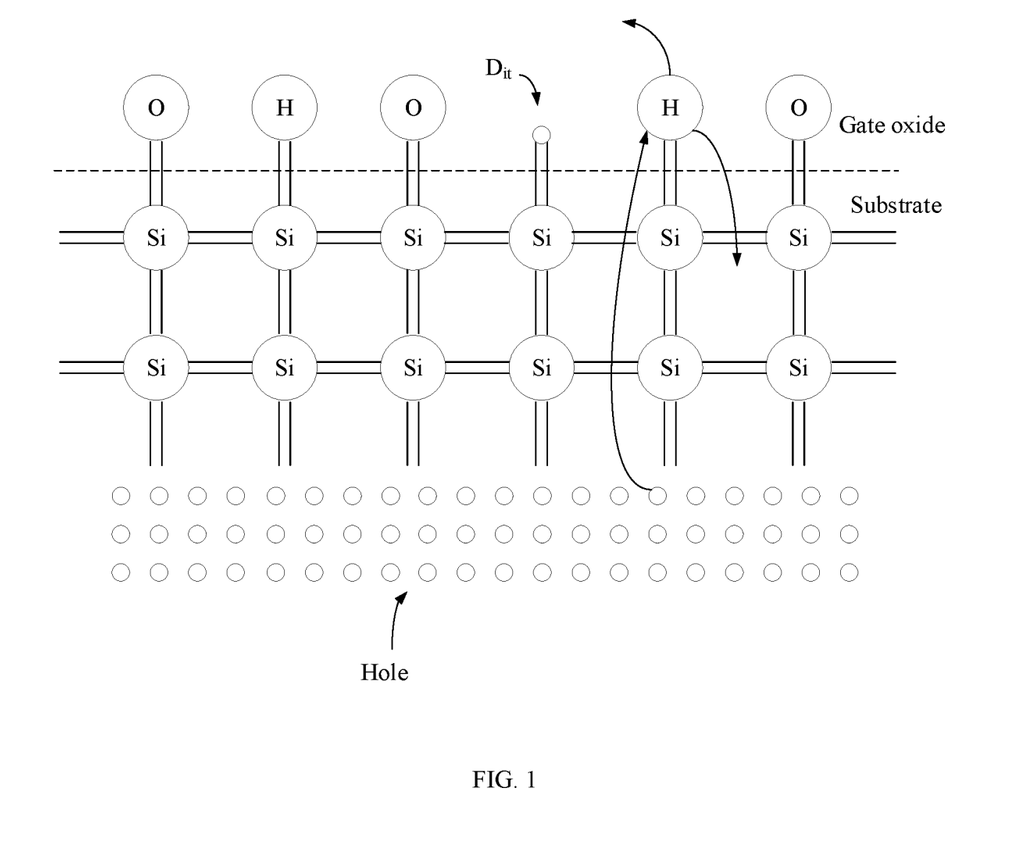
FIG. 1 is a schematic diagram of an NBTI effect of a PMOS.

The negative bias temperature instability (NBTI) effect refers to the degradation of a series of electrical parameters caused by the application of a negative bias to the PMOS at high temperature, which results in the PMOS being prone to failure and having low reliability. Referring to FIG. 1, which shows a schematic diagram of the NBTI effect of the PMOS, it can be seen from FIG. 1 that a silicon-hydrogen (H) bond is formed at the gate oxide (GOX, which contains silicon dioxide $SiO_2$)-substrate (which contains silicon Si) interface of the PMOS. When the PMOS is at a negative bias, under the action of a vertical electric field, holes are attracted to the interface to weaken the Si—H bond, in which case the hydrogen escapes from the silicon-hydrogen bond and diffuses into the silicon in the substrate, forming an interface trap ($D_{it}$), and thereby causing the NBTI effect.

Figure 2:
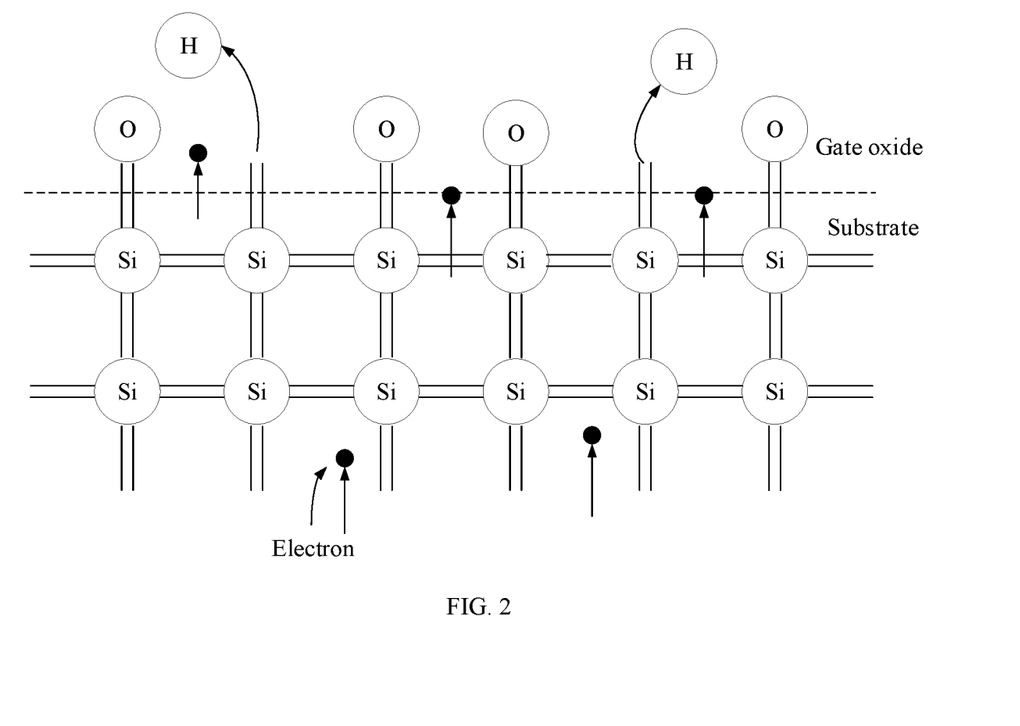
FIG. 2 is a schematic diagram of an HCI effect of an NMOS.

Referring to FIG. 2, which shows a schematic diagram of the hot carrier injection (HCI) effect, it can be seen from FIG. 2 that a silicon-hydrogen bond is formed at the gate oxide-substrate interface of the NMOS. When the NMOS is in the operating state, under the action of an electric field, electrons can penetrate the interface to break the silicon-hydrogen bond, forming an interface trap, and thereby leading to the degradation of some electrical parameters of the device.

The MOS provided in the related art is liable to cause the NBTI effect or the HCI effect due to the silicon-hydrogen bond at the gate oxide-substrate interface, resulting in a reduction in the reliability of the device.

BRIEF SUMMARY

According to some embodiments in this application, a method for making a MOSFET is disclosed in the following steps:

forming a gate oxide layer on a substrate, wherein the substrate comprises silicon, and the gate oxide layer comprises silicon dioxide;

depositing and forming a polysilicon (poly) layer on the gate oxide layer;

removing the polysilicon layer and the gate oxide layer in a target area by means of dry etching, wherein the remaining gate oxide layer forms a gate oxide of the MOSFET, and the remaining polysilicon layer forms a gate of the MOSFET;

performing lightly doped drain (LDD) implantation on the substrate at both sides of the gate, to form a first LDD area and a second LDD area respectively; and performing source drain (SD) implantation to form a source and a drain in the substrate at both sides of the gate respectively;

wherein before one of the steps after the depositing and forming a polysilicon layer on the gate oxide layer, fluorine ion implantation is performed to diffuse the fluorine element to an interface between the gate oxide and the substrate.

In example embodiments, the fluorine ion implantation is performed after the polysilicon layer is deposited and formed on the gate oxide layer and before the LDD implantation is performed on the substrate at both sides of the gate.

In example embodiments, the energy of the fluorine ion implantation is 10 KeV (KeV) to 100 KeV.

In example embodiments, the dose of the fluorine ion implantation is $1\times10^{14}/cm^2$ to $1\times10^{16}/cm^2$.

In example embodiments, the temperature during a process of removing the polysilicon layer and the gate oxide layer in the target area by means of dry etching is greater than 700° C.

In example embodiments, the fluorine ion implantation is performed after the LDD implantation is performed on the substrate at both sides of the gate and before the SD implantation is performed.

In example embodiments, the fluorine ion implantation is performed after the SD implantation is performed.

In example embodiments, the dose of the fluorine ion implantation is $1\times10^{14}/cm^2$ to $1\times10^{16}/cm^2$.

In example embodiments, the energy of the fluorine ion implantation is 1 KeV volt to 20 KeV.

In example embodiments, the angle of the fluorine ion implantation is 0 degree(°) to 45 degrees.

In example embodiments, after the performing SD implantation, the method further comprises:

performing a thermal treatment by means of a rapid thermal annealing (RTA) process.

In example embodiments, the temperature of the thermal treatment is 800° C. to 1200° C.

In example embodiments, the time of the thermal treatment is 5 seconds (s) to 15 seconds.

According to some embodiments in this application, a MOSFET is disclosed, comprising:

a substrate, wherein the substrate comprises silicon;

a gate oxide, wherein the gate oxide is formed on the substrate;

a gate, wherein the gate is formed on the gate oxide;

a first LDD area, wherein the first LDD area is formed in the substrate and located at one side of the gate;

a second LDD area, wherein the second LDD area is formed in the substrate and located at the other side of the gate;

a source, wherein the source is formed in the substrate and located at one side of the gate; and a drain, wherein the drain is formed in the substrate and located at the other side of the gate;

wherein an interface between the gate oxide and the substrate contains the fluorine element, and during a process of making the MOSFET, after a polysilicon layer corresponding to the gate is formed, fluorine ion implantation is performed to diffuse the fluorine element to the interface.

The technical solutions of the present application comprise at least the following advantages:

In the process of making the MOSFET, after the polysilicon layer corresponding to the gate is formed, the fluorine ion implantation is performed to diffuse the fluorine element to the interface between the gate oxide and the substrate, such that the fluorine element partially substitutes for the hydrogen element at the interface. Since the bond energy of a silicon-fluorine bond is greater than the bond energy of a silicon-hydrogen bond, it is difficult for holes or electrons to break the silicon-fluorine bond during operation of the MOS, thereby weakening an NBTI effect or HCI effect of the device, reducing the probability of a device failure, and improving the reliability of the device.

BRIEF DESCRIPTION OF THE DRAWINGS

In order to more clearly explain the specific implementations of the present application or the technical solutions in the prior art, the drawings required in description of the specific implementations or the prior art will be briefly described below. It is obvious that the drawings described below are some implementations of the present application, and one skilled in the art could also obtain other drawings on the basis of these drawings without contributing any inventive labor.

DETAILED DESCRIPTION OF THE DISCLOSURE

The technical solution of the present application will be clearly and completely described below with reference to the drawings. Obviously, the described embodiments are part of the embodiments of the present application, instead of all of them. Based on the embodiments in the present application, all other embodiments obtained by one skilled in the art without contributing any inventive labor shall fall into the protection scope of the present application.

In the description of the present application, it should be noted that the orientation or position relationship indicated by the terms "center", "upper", "lower", "left", "right", "vertical", "horizontal", "inner", "outer", etc. is based on the orientation or position relationship shown in the drawings, intended only for the convenience of describing the present application and simplifying the description, rather than indicating or implying that the apparatus or element referred to necessarily has a specific orientation or is configured or operated in a specific orientation, and thus cannot be construed as a limitation on the present application. In addition, the terms "first", "second", and "third" are used for descriptive purposes only, and cannot be construed as indicating or implying relative importance.

In the description of the present application, it should be noted that, unless otherwise clearly specified and limited, the terms "mounting", "coupling", and "connecting" should be understood in a broad sense, for example, a connection can be a fixed connection, a detachable connection, or an integrated connection, can be a mechanical connection or an electrical connection, can be a direct connection, an indirect connection implemented by means of an intermedium, or an internal connection between two components, and can be a wireless connection or a wired connection. One skilled in the art could understand the specific meanings of the above terms in the present application on the basis of specific situations.

In addition, the technical features involved in different embodiments of the present application described below can be combined with each other in the case of no conflict.

Figure 3:
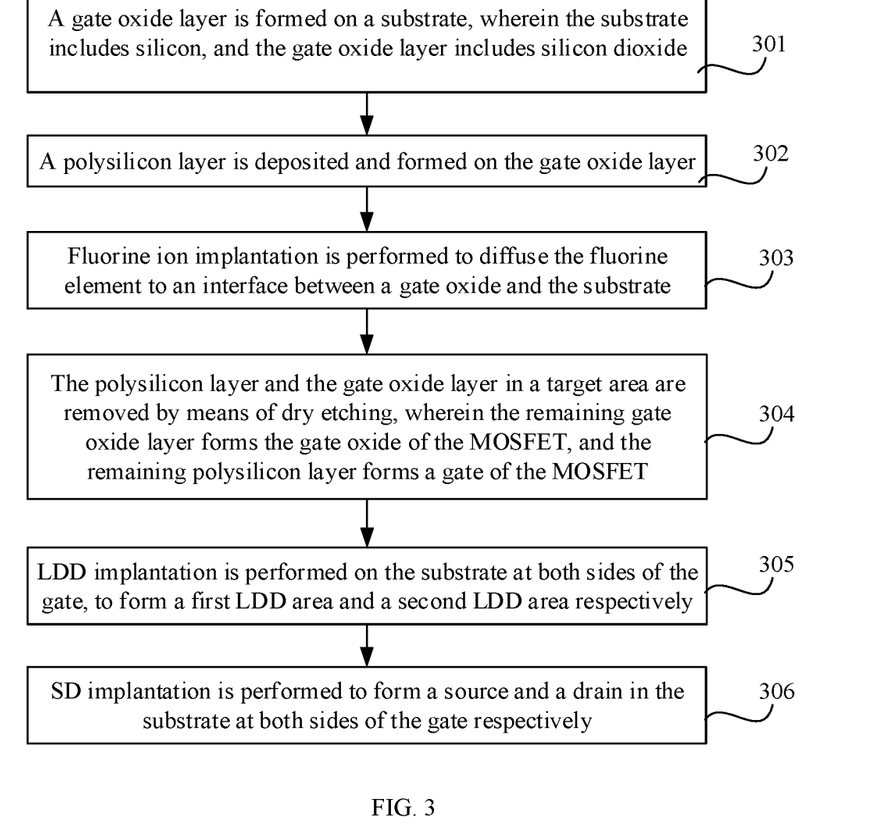
FIG. 3 is a flowchart of a method for making a MOSFET provided in an exemplary embodiment of the present application.

Referring to FIG. 3, which illustrates a flowchart of a method for making a MOSFET provided in an exemplary embodiment of the present application, it can be seen that the method includes the following steps.

Step 301. A gate oxide layer is formed on a substrate, wherein the substrate includes silicon, and the gate oxide layer includes silicon dioxide.

Figure 4:
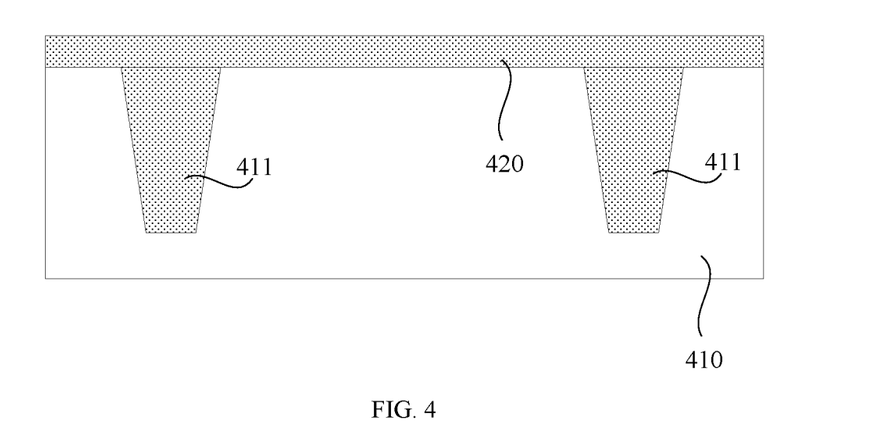
FIG. 4 is a schematic sectional diagram of forming the gate oxide layer on the substrate in the method for making a MOSFET provided in an exemplary embodiment of the present application.

Referring to FIG. 4, which shows a schematic sectional diagram of forming the gate oxide layer on the substrate, it can be seen from FIG. 4 that the substrate 410 includes silicon, and the gate oxide layer 420 includes silicon dioxide. The gate oxide layer 420 can be deposited and formed on the substrate 410 by means of a chemical vapor deposition (CVD) process.

Generally, the substrate 410 is more or less doped with hydrogen during a making process thereof, thereby forming a silicon-hydrogen bond on the surface thereof.

In example embodiments, a shallow trench isolation (STI) structure 411 is further formed in the substrate 410, and an area surrounded by the STI structure 411 is an active area of the MOSFET.

Step 302. A polysilicon layer is deposited and formed on the gate oxide layer.

Figure 5:
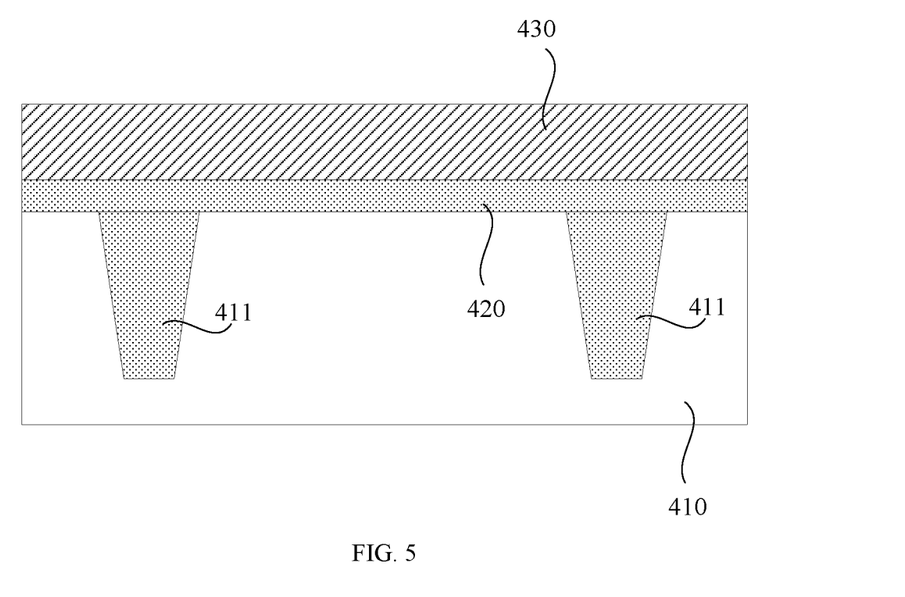
FIG. 5 is a schematic sectional diagram of depositing and forming the polysilicon layer in the method for making a MOSFET provided in an exemplary embodiment of the present application.

Reference is made to FIG. 5, which shows a schematic sectional diagram of depositing and forming the polysilicon layer. In example embodiments, as can be seen from FIG. 4, the polysilicon layer 430 can be deposited and formed on the gate oxide layer 420 by means of a CVD process.

Step 303. Fluorine ion implantation is performed to diffuse the fluorine element to an interface between a gate oxide and the substrate.

Figure 6:
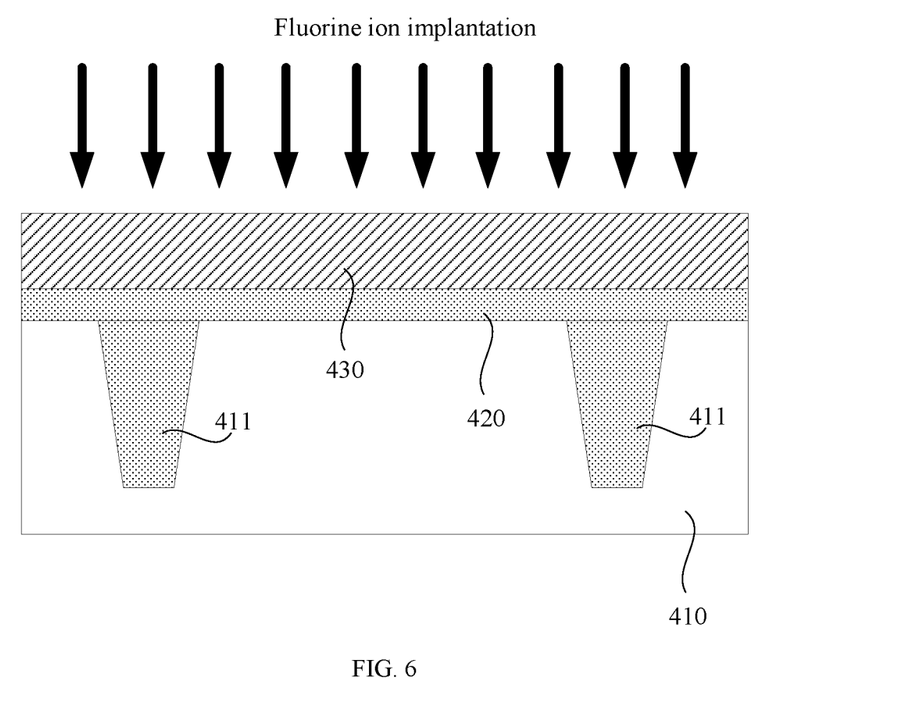
FIG. 6 is a schematic sectional diagram of performing the fluorine ion implantation after the polysilicon layer is deposited in the method for making a MOSFET provided in an exemplary embodiment of the present application.

Reference is made to FIG. 6, which shows a schematic sectional diagram of performing the fluorine ion implantation after the polysilicon layer is deposited. The fluorine ion implantation is performed to diffuse the fluorine element to the interface between the gate oxide and the substrate, such that the fluorine element partially substitutes for the hydrogen element at the interface. Since the bond energy of a silicon-fluorine bond is greater than the bond energy of a silicon-hydrogen bond, it is difficult for holes or electrons to break the silicon-fluorine bond during operation of the MOS, thereby weakening an NBTI effect or HCI effect of the device, reducing the probability of a device failure, and improving the reliability of the device.

Since the fluorine ion implantation needs to penetrate the polysilicon layer 430, in this step, the energy of the fluorine ion implantation is relatively large. In example embodiments, in step 303, the energy of the fluorine ion implantation is 10 KeV to 100 KeV; and in example embodiments, the dose of the fluorine ion implantation is $1 \times 10^{14}/cm^2$ to $1 \times 10^{16}/cm^2$.

Step 304. The polysilicon layer and the gate oxide layer in a target area are removed by means of dry etching, wherein the remaining gate oxide layer forms the gate oxide of the MOSFET, and the remaining polysilicon layer forms a gate of the MOSFET.

Figure 7:
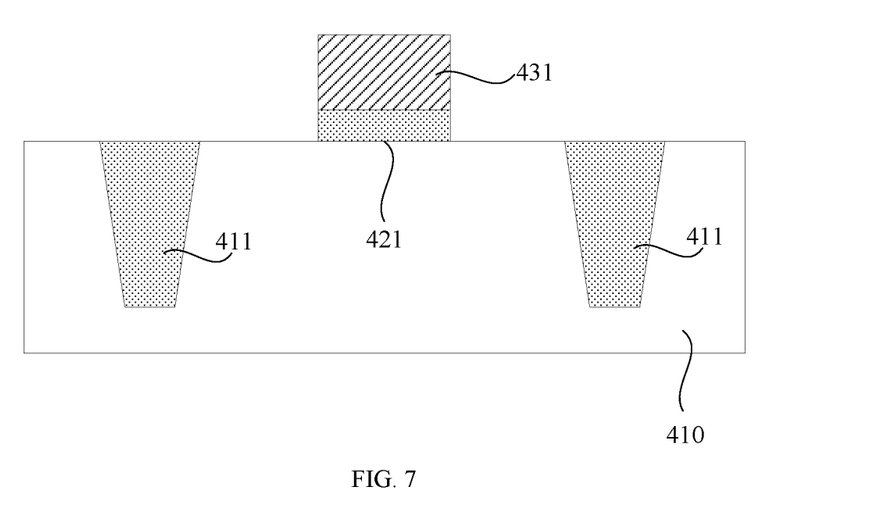
FIG. 7 a schematic sectional diagram of forming the gate oxide and the gate in the method for making a MOSFET provided in an exemplary embodiment of the present application.

Reference is made to FIG. 7, which shows a schematic sectional diagram of forming the gate oxide and the gate. In example embodiments, as can be seen from FIG. 6, in step 304, "removing the polysilicon layer and the gate oxide layer in a target area by means of dry etching" includes but is not limited to: covering an area corresponding to the gate 431 with a photoresist by means of photolithography, and performing dry etching to remove the polysilicon layer 430 and the gate oxide layer 420 in the target area until the substrate 410 in the target area is exposed, wherein the remaining polysilicon layer forms the gate 431, and the remaining gate oxide layer forms the gate oxide 421. The target area is an area other than the area corresponding to the gate 431.

In example embodiments, in step 304, the temperature during the process of removing the polysilicon layer and the gate oxide layer in the target area by means of dry etching is greater than 700° C. (for example, the temperature can be 800° C.). At a temperature greater than 700° C., the fluorine element can diffuse more deeply, and the effect of substituting for the hydrogen element is better.

Step 305. LDD implantation is performed on the substrate at both sides of the gate, to form a first LDD area and a second LDD area respectively.

Figure 8:
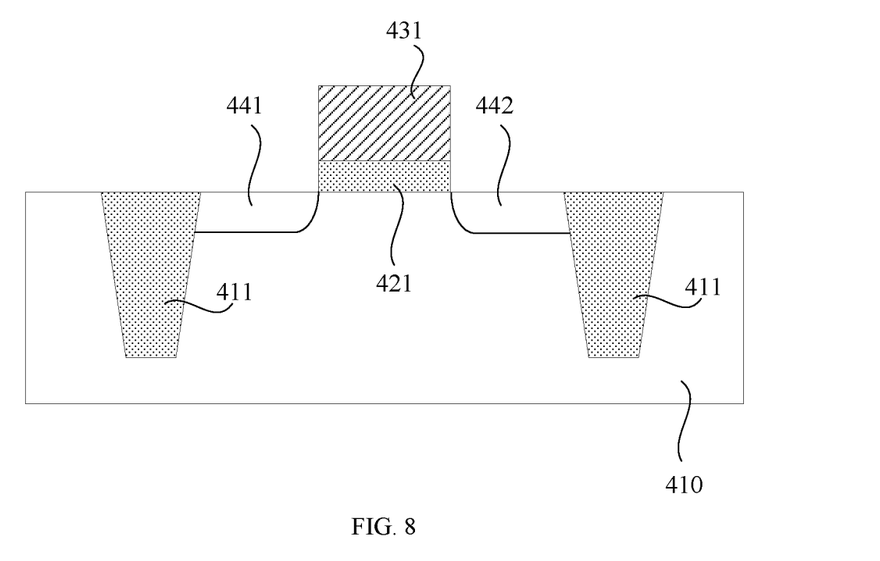
FIG. 8 is a schematic diagram of forming the first LDD area and the second LDD area after the LDD implantation is performed in the method for making a MOSFET provided in an exemplary embodiment of the present application.

Reference is made to FIG. 8, which shows a schematic diagram of forming the first LDD area and the second LDD area after the LDD implantation is performed. In example embodiments, as can be seen from FIG. 7, ions for the LDD implantation are ions of a first type, and after the LDD implantation is performed, the first LDD area 441 and the second LDD area 442 are respectively formed in the substrate 410 at both sides of the gate 431.

Step 306. SD implantation is performed to form a source and a drain in the substrate at both sides of the gate respectively.

Figure 9:
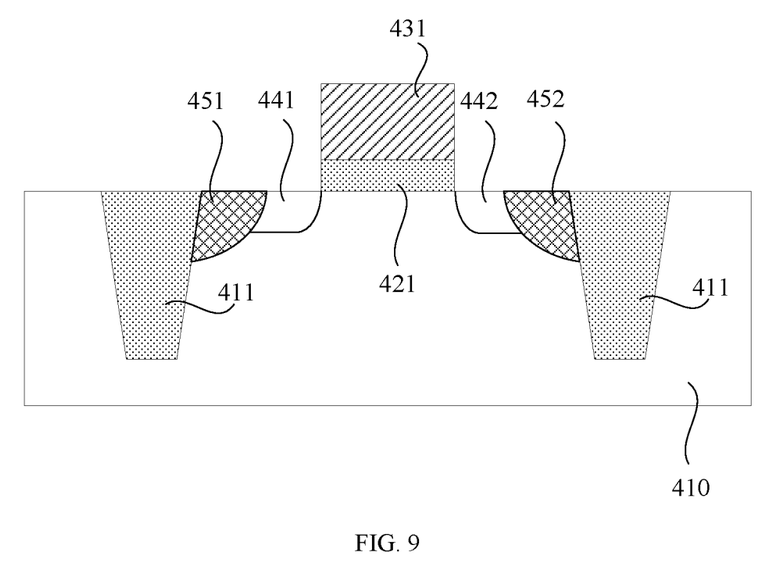
FIG. 9 is a schematic diagram of forming the source and the drain after the SD implantation is performed in the method for making a MOSFET provided in an exemplary embodiment of the present application.

Reference is made to FIG. 9, which shows a schematic diagram of forming the source and the drain after the SD implantation is performed. In example embodiments, as can be seen from FIG. 8, ions for the SD implantation are ions of a second type, and after the SD implantation is performed, the source 451 and the drain 452 are respectively formed in the substrate 410 at both sides of the gate 431.

Figure 10:
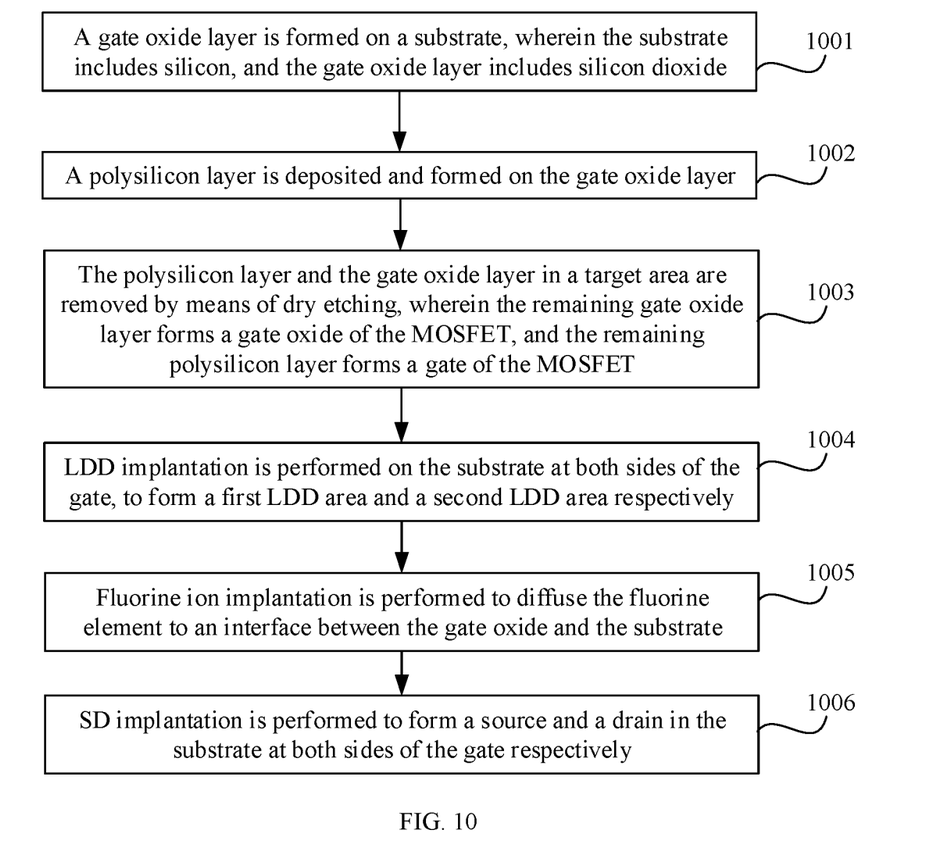
FIG. 10 is a flowchart of a method for making a MOSFET provided in an exemplary embodiment of the present application.

Referring to FIG. 10, which shows a flowchart of a method for making a MOSFET provided in an exemplary embodiment of the present application, it can be seen that the method includes the following steps.

Step 1001. A gate oxide layer is formed on a substrate, wherein the substrate includes silicon, and the gate oxide layer includes silicon dioxide.

For the implementation of this step, reference can be made to the embodiment of FIG. 3 and FIG. 4, and details are not described herein.

Step 1002. A polysilicon layer is deposited and formed on the gate oxide layer.

For the implementation of this step, reference can be made to the embodiment of FIG. 3 and FIG. 5, and details are not described herein.

Step 1003. The polysilicon layer and the gate oxide layer in a target area are removed by means of dry etching, wherein the remaining gate oxide layer forms a gate oxide of the MOSFET, and the remaining polysilicon layer forms a gate of the MOSFET.

For the implementation of this step, reference can be made to the embodiment of FIG. 3 and FIG. 7, and details are not described herein.

Step 1004. LDD implantation is performed on the substrate at both sides of the gate, to form a first LDD area and a second LDD area respectively.

For the implementation of this step, reference can be made to the embodiment of FIG. 3 and FIG. 8, and details are not described herein.

Step 1005. Fluorine ion implantation is performed to diffuse the fluorine element to an interface between the gate oxide and the substrate.

Figure 11:
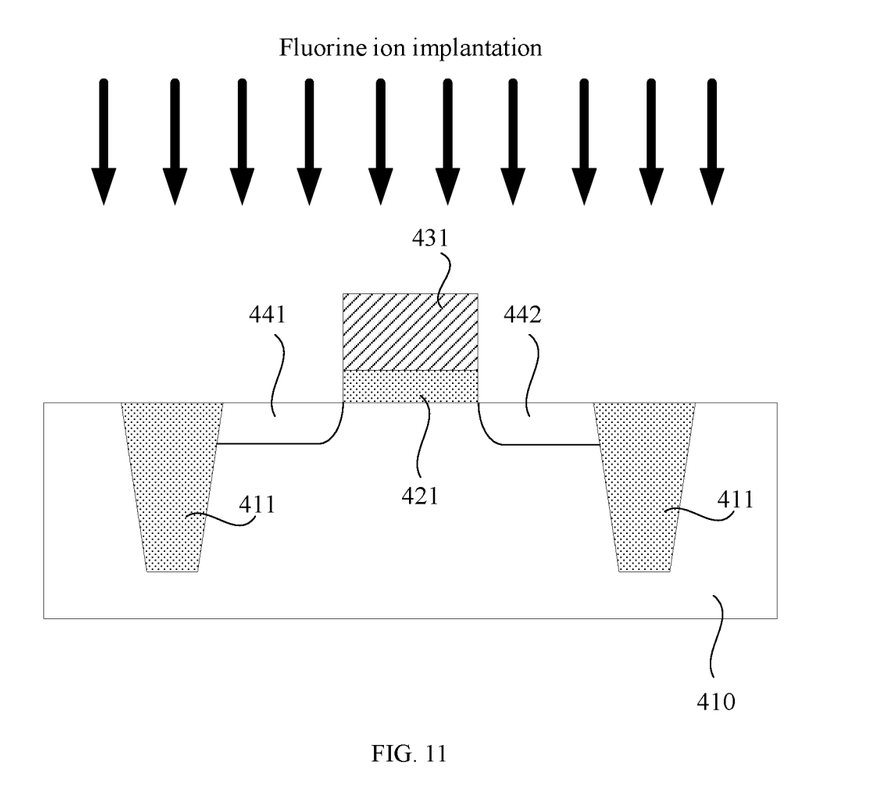
FIG. 11 is a schematic sectional diagram for the method for making a MOSFET in which fluorine ion implantation is performed after LDD implantation is performed, provided in an exemplary embodiment of the present application.

Reference is made to FIG. 11, which shows a schematic sectional diagram of performing the fluorine ion implantation after the LDD implantation. The fluorine ion implantation is performed to diffuse the fluorine element to the interface between the gate oxide and the substrate, such that the fluorine element partially substitutes for the hydrogen element at the interface. Since the bond energy of a silicon-fluorine bond is greater than the bond energy of a silicon-hydrogen bond, it is difficult for holes or electrons to break the silicon-fluorine bond during operation of the MOS, thereby weakening an NBTI effect or HCI effect of the device, reducing the probability of a device failure, and improving the reliability of the device.

In example embodiments, in step 1005, the energy of the fluorine ion implantation is 1 KeV volt to 20 KeV; in example embodiments, the dose of the fluorine ion implantation is $1 \times 10^{14}/cm^2$ to $1 \times 10^{16}/cm^2$; and in example embodiments, the angle of the fluorine ion implantation is 0 degree to 45 degrees. The implantation angle is an angle between a fluorine ion beam and the normal of the substrate 410.

Step 1006. SD implantation is performed to form a source and a drain in the substrate at both sides of the gate respectively.

For the implementation of this step, reference can be made to the embodiment of FIG. 3 and FIG. 9, and details are not described herein.

Figure 12:
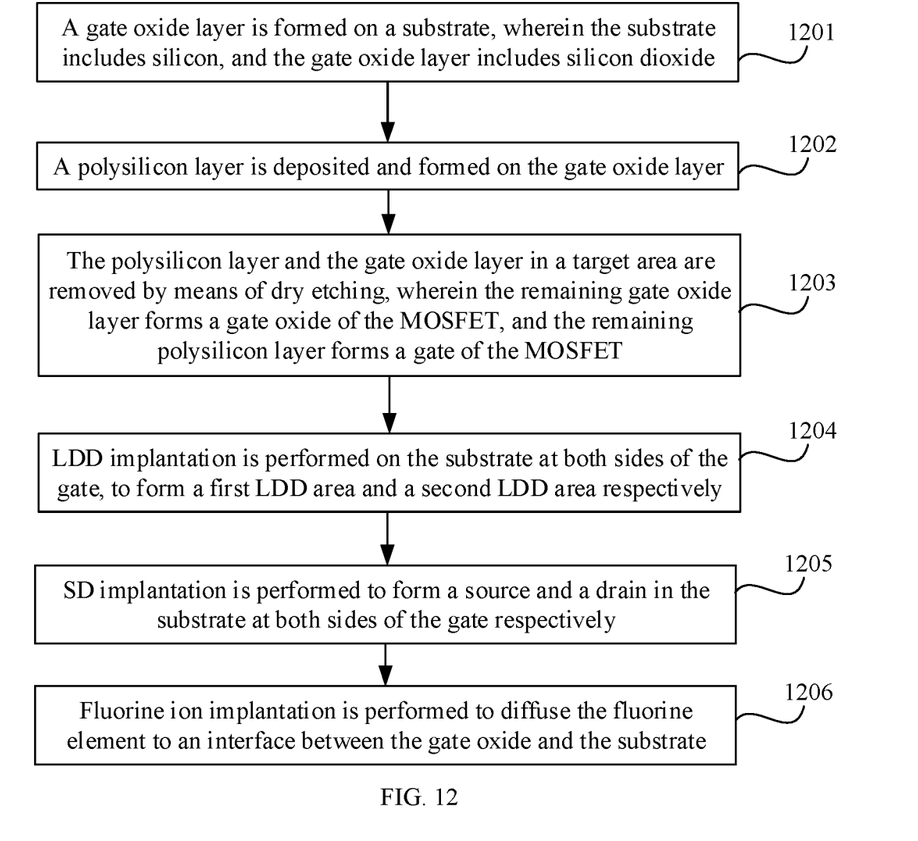
FIG. 12 is a flowchart of a method for making a MOSFET provided in an exemplary embodiment of the present application.

Referring to FIG. 12, which shows a flowchart of a method for making a MOSFET provided in an exemplary embodiment of the present application, it can be seen that the method includes the following steps.

Step 1201. A gate oxide layer is formed on a substrate, wherein the substrate includes silicon, and the gate oxide layer includes silicon dioxide.

For the implementation of this step, reference can be made to the embodiment of FIG. 3 and FIG. 4, and details are not described herein.

Step 1202. A polysilicon layer is deposited and formed on the gate oxide layer.

For the implementation of this step, reference can be made to the embodiment of FIG. 3 and FIG. 5, and details are not described herein.

Step 1203. The polysilicon layer and the gate oxide layer in a target area are removed by means of dry etching, wherein the remaining gate oxide layer forms a gate oxide of the MOSFET, and the remaining polysilicon layer forms a gate of the MOSFET.

For the implementation of this step, reference can be made to the embodiment of FIG. 3 and FIG. 7, and details are not described herein.

Step 1204. LDD implantation is performed on the substrate at both sides of the gate, to form a first LDD area and a second LDD area respectively.

For the implementation of this step, reference can be made to the embodiment of FIG. 3 and FIG. 8, and details are not described herein.

Step 1205. SD implantation is performed to form a source and a drain in the substrate at both sides of the gate respectively.

For the implementation of this step, reference can be made to the embodiment of FIG. 3 and FIG. 9, and details are not described herein.

Step 1206. Fluorine ion implantation is performed to diffuse the fluorine element to an interface between the gate oxide and the substrate.

Figure 13:
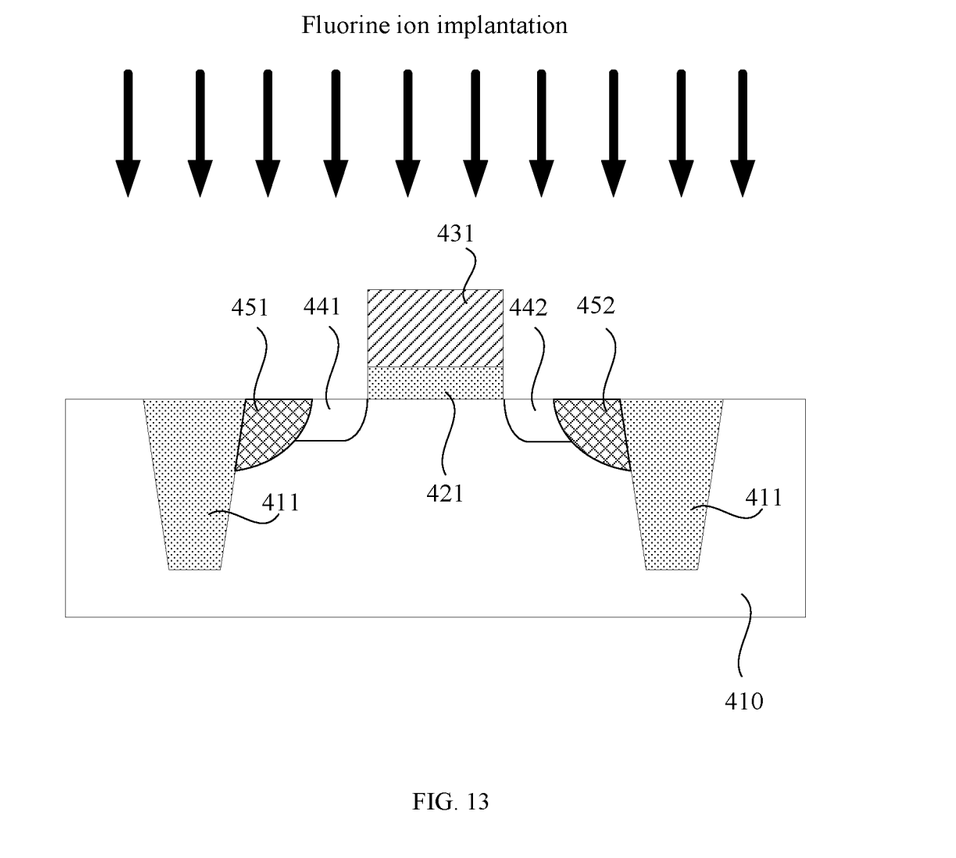
FIG. 13 is a schematic sectional diagram for the method for making a MOSFET in which fluorine ion implantation is performed after SD implantation is performed, provided in an exemplary embodiment of the present application.

Reference is made to FIG. 13, which shows a schematic sectional diagram of performing the fluorine ion implantation after the SD implantation. The fluorine ion implantation is performed to diffuse the fluorine element to the interface between the gate oxide and the substrate, such that the fluorine element partially substitutes for the hydrogen element at the interface. Since the bond energy of a silicon-fluorine bond is greater than the bond energy of a silicon-hydrogen bond, it is difficult for holes or electrons to break the silicon-fluorine bond during operation of the MOS, thereby weakening an NBTI effect or HCI effect of the device, reducing the probability of a device failure, and improving the reliability of the device In example embodiments, in step 1206, the energy of the fluorine ion implantation is 1 KeV volt to 20 KeV; in example embodiments, the dose of the fluorine ion implantation is $1\times10^{14}/cm^2$ to $1\times10^{16}/cm^2$; and in example embodiments, the angle of the fluorine ion implantation is 0 degree to 45 degrees. The implantation angle is an angle between a fluorine ion beam and the normal of the substrate 410.

In example embodiments, in the embodiment of FIG. 3, the embodiment of FIG. 10, and the embodiment of FIG. 12, after the SD implantation is performed, the method further includes: performing a thermal treatment by means of an RTA process. In example embodiments, the temperature of the thermal treatment is 800° C. to 1200° C.; and in example embodiments, the time of the thermal treatment is 5 seconds to 15 seconds.

Reference is made to FIG. 8, which shows a schematic sectional view of a MOSFET provided in an exemplary embodiment of the present application. The MOSFET can be fabricated by means of any of the embodiments described above, and includes:
  a substrate 410 comprising silicon;
  a gate oxide 421 formed on the substrate 410;
  a gate 431 formed on the gate oxide 421;
  a first LDD area 441 formed in the substrate 410 and located at one side of the gate 431;
  a second LDD area 442 is formed in the substrate 410 and located at the other side of the gate 431;
  a source 451 formed in the substrate 410 and located at one side of the gate 431; and
  a drain 452 formed in the substrate 410 and located at the other side of the gate 431.

An interface between the gate oxide 421 and the substrate 410 contains the fluorine element, and during a process of fabricating the MOSFET, after a polysilicon layer corresponding to the gate 431 is formed, fluorine ion implantation is performed to diffuse the fluorine element to the interface.

In example embodiments, in this embodiment of the present application, an STI structure 411 disposed in a surrounding mode is further formed in the substrate 410.

It should be noted that, in the above embodiments, if the ions of the first type are P-type ions, the ions of the second type are N-type ions; and if the ions of the first type are N-type ions, the ions of the second type are P-type ion.

Obviously, the above embodiments are merely examples used for clear description, rather than for limitation on the implementations. One skilled in the art could also make other changes or modifications in different forms on the basis of the above description. There is no need and way to exhaustively list all of the implementations herein, but obvious changes or modifications derived herefrom still fall within the protection scope created by the present application.

What is claimed is:

1. A method for making a MOSFET, comprising steps of:
  forming a gate oxide layer on a substrate, wherein the substrate comprises silicon, and the gate oxide layer comprises silicon dioxide;
  depositing and forming a polysilicon layer on the gate oxide layer;
  removing the polysilicon layer and the gate oxide layer in a target area by means of dry etching, wherein the remaining gate oxide layer forms a gate oxide of the MOSFET, and the remaining polysilicon layer forms a gate of the MOSFET;
  performing LDD implantation on the substrate at both sides of the gate, to form a first LDD area and a second LDD area respectively; and
  performing SD implantation to form a source and a drain in the substrate at both sides of the gate respectively;
  wherein before one of the steps after the depositing and forming a polysilicon layer on the gate oxide layer, fluorine ion implantation is performed to diffuse the fluorine element to an interface between the gate oxide and the substrate;
  wherein the energy of the fluorine ion implantation is 10 KeV to 100 KeV, the dose of the fluorine ion implantation is $1\times10^{14}/cm^2$ to $1\times10^{16}/cm^2$ and the temperature during the removing the polysilicon layer and the gate oxide layer in the target area by means of dry etching is greater than 700° C.; and wherein the dose of the fluorine ion implantation is $1\times10^{14}/cm^2$ to $1\times10^{16}/cm^2$, the energy of the fluorine ion implantation is 1 KeV volt to 20 KeV and the angle of the fluorine ion implantation is 0 degree to 45 degrees.

2. The method according to claim 1, wherein the fluorine ion implantation is performed after the polysilicon layer is deposited and formed on the gate oxide layer and before the LDD implantation is performed on the substrate at both sides of the gate.

3. The method according to claim 1, wherein the fluorine ion implantation is performed after the LDD implantation is performed on the substrate at both sides of the gate and before the SD implantation is performed.

4. The method according to claim 1, wherein the fluorine ion implantation is performed after the SD implantation is performed.

5. The method according to claim 1, after the performing SD implantation, further comprising:

performing a thermal treatment by means of an RTA process.

6. The method according to claim 5, wherein the temperature of the thermal treatment is 800° C. to 1200° C. and the time of the thermal treatment is 5 seconds to 15 seconds.

* * * * *